United States Patent [19]

Kakinuma et al.

[11] Patent Number: 4,631,198
[45] Date of Patent: Dec. 23, 1986

[54] METHOD OF MANUFACTURING THIN AMORPHOUS SILICON FILM

[75] Inventors: Hiroaki Kakinuma; Satoshi Nishikawa; Tsukasa Watanabe, all of Tokyo, Japan

[73] Assignee: Oki Electric Industry Co., Ltd., Tokyo, Japan

[21] Appl. No.: 759,194

[22] Filed: Jul. 26, 1985

Related U.S. Application Data

[63] Continuation-in-part of Ser. No. 606,095, May 2, 1984, abandoned.

[30] Foreign Application Priority Data

May 16, 1983 [JP] Japan .................................. 58-84121

[51] Int. Cl.$^4$ .............................................. B05D 3/06
[52] U.S. Cl. ............................................ 427/38; 427/74
[58] Field of Search ................................. 427/39, 74

[56] References Cited

U.S. PATENT DOCUMENTS 4,568,626 2/1986 Ogawa ........................... 427/39 X Primary Examiner—Bernard D. Pianalto
Attorney, Agent, or Firm—Pollock, VandeSande & Priddy

[57] ABSTRACT

A method of manufacturing thin amorphous silicon hydride film is disclosed by using a plasma CVD process. The method comprises the steps of providing a substrate for supporting the amorphous silicon hydride film, providing raw material gas produced by mixing hydrogen silicide $Si_nH_{2n+2}(n \geq 1)$ with additive gas in the concentration from about 0.1 to 10 parts per million by volume, setting a gas flow rate of the raw material gas in the range from about 200 to about 700 SCCM, applying radio frequency electric power to said gas in plasma CVD apparatus, said power being selected in the range from about 300 W to about 700 W to result in a ratio of electric power in watts to gas flow rate in SCCM of at least about 1, and growing thin amorphous silicon hydride film on the substrate from the raw material gas.

6 Claims, 3 Drawing Figures

FIG_1
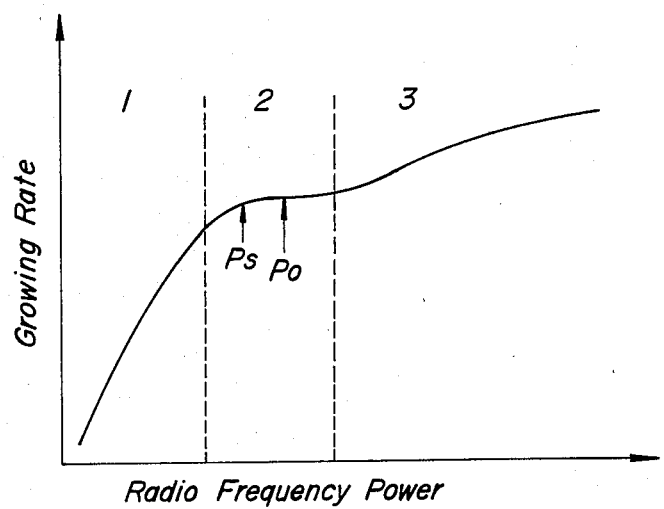
FIG_2
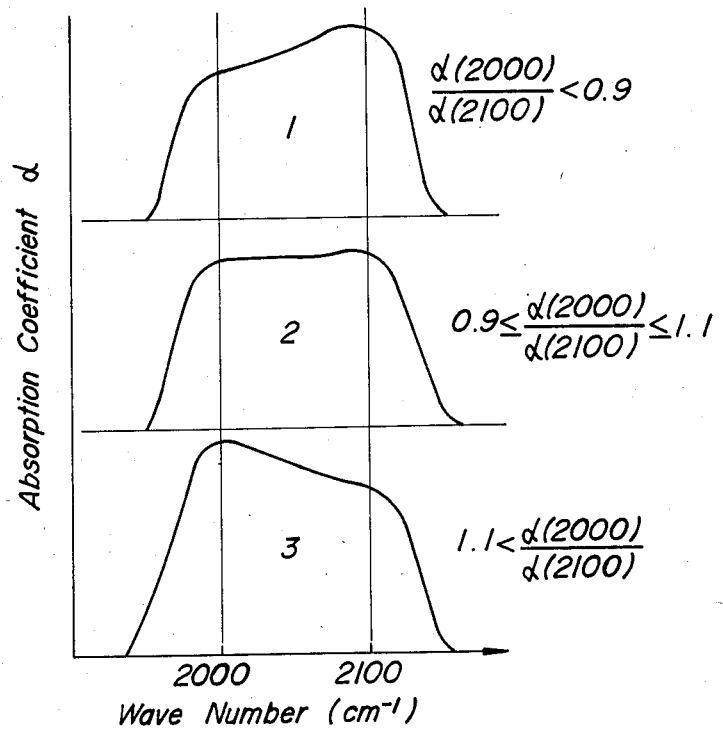

METHOD OF MANUFACTURING THIN AMORPHOUS SILICON FILM

This application is a continuation-in-part of our co-pending application Ser. No. 606,095, filed on May 2, 1984 now abandoned.

BACKGROUND OF THE INVENTION

The present invention relates to a method of manufacturing amorphous silicon hydride film for use in an electro-photographic photoreceptor.

When producing a drum of electrophotographic photoreceptor by forming an amorphous silicon hydride (hereinafter referred to as a—Si:H) film, it is necessary to make the thickness of the film ore than 20 μm in order to obtain sufficient initial voltage (generally more than 500 V). To this end it is desirable to make the deposition rate of the film large, and processes have been tried in which non diluted $SiH_4$ at a few hundreds SCCM flow and radio frequency power up to about 1 KW, or in which disilane $Si_2H_6$ having a large deposition rate have been utilized.

If the deposition rate is increased in the small RF power region, however, the bond of $SiH_2$ or $(SiH_2)_n$ becomes increased and a plurality of traps are generated in the band gap so that light sensitivity becomes decreased and residual voltage becomes increased.

On the contrary film having a major part of the H substituent in SiH, which is suitable for a solar cell, has good photoconducting properties and a very slow deposition rate.

Since a—Si:H is under a metaequilibrium state the internal stress is very large and its kind (compressive stress or tensile stress) and its size depend on the growth conditions. If the film is made large in thickness, therefore, the film is exfoliated from the substrate.

As described above, in order to form an electrophotographic photoreceptor, and thus a photoreceptor drum by using a—Si:H, it is necessary to satisfy the following conditions simultaneously, (1) deposition rate is high, (2) photoconductivity is suitable, (3) internal stress is small.

SUMMARY OF THE INVENTION

It is an object of the present invention to overcome the above disadvantages of conventional methods.

It is another object of the present invention to provide a method of manufacturing amorphous silicon hydride film which satisfies the above three conditions, i.e., high deposition rate, good photoconductivity and small internal stress.

According to the present invention there is provided a method of manufacturing thin amorphous silicon film by a plasma CVD process comprising the steps of providing a substrate for supporting the amorphous silicon film, providing raw material gas produced by mixing hydrogen silicide $Si_nH_{2n+2}(n \geq 1)$ with additive gas in the concentration from about 0.1 to 10 parts per million by volume, setting a gas flow rate of the raw material gas in the range from about 200 to about 700 SCCM, applying radio frequency electric power to said gas in plasma CVD apparatus, said power being selected in the range from about 300 W to about 700 W to result in a ratio of electric power in watts to gas flow rate in SCCM of at least about 1, and growing thin amorphous silicon hydride film on the substrate from the raw material gas.

BRIEF DESCRIPTION OF THE DRAWINGS

These and other features and advantages of the present invention will become readily apparent from the following detailed description of one embodiment of the present invention, particularly when taken in conjunction with the accompanying drawings wherein like reference numerals designate like functionally equivalent parts throughout, and wherein:

FIG. 1 shows a characteristic relation between the deposition (growing) rate and radio frequency power of a—Si:H due to a plasma CVD applied to a method of manufacturing thin amorphous silicon film according to the present invention;

FIG. 2 is an explanatory view showing infrared absorption spectrum of 2000 to 2100 $cm^{-1}$ corresponding to zones 1, 2 and 3 shown in FIG. 1.

DESCRIPTION OF THE PREFERRED EMBODIMENT

Figure 3:
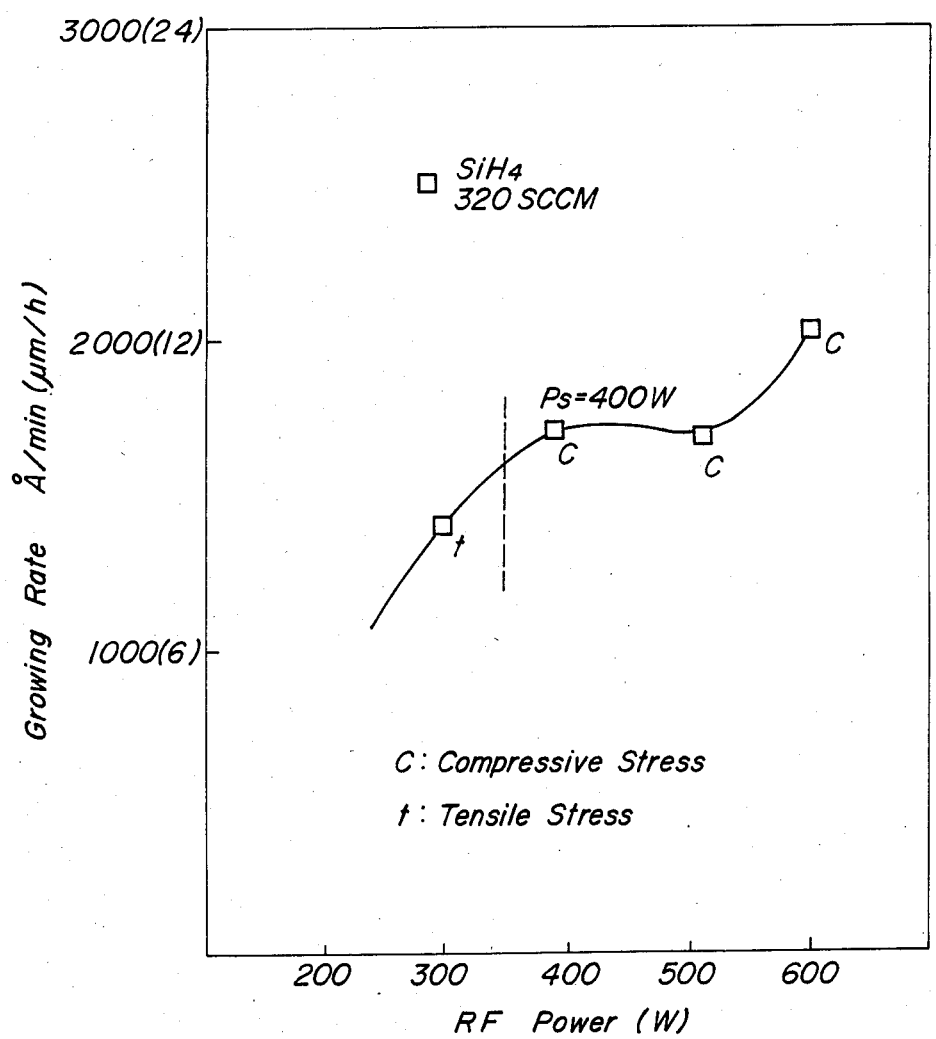
FIG. 3 shows another characteristic relation between the deposition (growing) rate and radio frequency power of a—Si:H due to a plasma CVD applied to a method of manufacturing thin amorphous silicon film according to the present invention.

Referring now to the drawings, there is shown an embodiment of a method of manufacturing thin amorphous silicon film according to the present invention.

At first, a pipe-shaped substrate having a diameter of 8 to 12 cm and a length of 30 to 50 cm is prepared. A glass, a metal, a conductive ITO, and a tin oxide may be utilized as a substrate. A raw material consists of monosilane and additive gas of 0.1 to 10 VPPM (at lest one selected from a group of $B_2H_6$, $PH_3$, $O_2$, $N_2$, $N_2O$ (laughing gas) and hydrocarbon. If the temperature of the substrate is 200° to 300° C., the silane flow rate is 200 to 700 SCCM, and the gas pressure is 1 to 3 Torr, when the radio frequency power is changed in a range of 0 to 1 KW, a relation between a deposition or growth rate and a radio frequency power P may be obtained as shown in FIG. 1 in which three zones 1, 2 and 3 having different properties, respectively, are present.

That is, FIG. 1 shows a relation between the deposition rate and radio frequency power of a—Si:H formed by plasma CVD process. In this case, when a gas pressure is less than 1 Torr during growth, the photoconductivity becomes preferable but the growth rate becomes very slow and the a—Si:H film cannot be utilized as an electrophotographic photoreceptor. When the gas pressure is more than 3 Torr, glow discharge becomes unstable.

In FIG. 1 the zone 1 is a region in which the deposition rate is increased in proportion to the radio frequency power. In this zone 1, as shown in FIG. 2 (reference numerals 1, 2 and 3 correspond to the zones 1, 2 and 3 shown in FIG. 1, respectively), the bonding conditions of hydrogen due to infrared absorption spectrum are so determined that the absorption $\alpha(2100)$ of 2100 $cm^{-1}$ showing $Si-H_2$ bond is larger than the absorption $\alpha(2000)$ of 2000 $cm^{-1}$ showing Si—H bond.

The internal stress shows a tensile stress and the smaller the radio frequency power the stronger the stress. The zone 3 is a region in which, after the deposition rate becomes saturated, the deposition rate is again increased (under some growth conditions not increased). In this case absorption $\alpha(2000)$ is larger than the absorption $\alpha(2100)$. The internal stress shows compressive stress and the larger the radio frequency power P the stronger the stress.

The zone 2 is a region in which the deposition rate becomes saturated. If the minimum power of saturation is Ps (FIG. 1) the range of high frequency power of saturation is as follows:

$$0.7Ps \leq P \leq 1.3Ps$$

In this zone the internal stress changes from the tensile stress to the compressive stress with an increase of radio frequency power P; and a point Po (FIG. 1), in which the internal stress becomes zero, is smaller than or larger than the Ps depending upon the growth condition. The film shown by Po satisfies the condition that $\alpha(2000)/\alpha(2100) \simeq 1$.

As a first example, in the case of SiH$_4$ flow rate of 500 SCCM, gas pressure of 2 Torr and substrate temperature of 250° C. as well as the change of radio frequency power, the stress and $\alpha(2000)/\alpha(2100)$, the surface area of the pipe-shaped substrate being about 1,500 cm$^2$, are shown in following table I (the strength of stress is measured). Viewing from the internal stress the case of $\alpha(2000)/\alpha(2100) \simeq 1$ is ideal, but if the adhesion of the substrate and the film is sufficient there is no problem practically even if $0.9 \simeq \alpha(2000)/\alpha(2100) \simeq 1.1$.

TABLE I

| (at 500 SCCM for SiH$_4$) | | |
|---|---|---|
| radio frequency power (W) | full stress [× 10$^{10}$ dyn·cm$^{-2}$] | $\alpha(2000)/\alpha(2100)$ |
| 300 | tensile −4.7 | 1.3 |
| 400 | tensile −2.5 | 1.3 |
| 500 | tensile −1.4 | 1.1 |
| 600 | tensile −0.6 | 1.1 |
| 650 | tensile 0.1 | 1.0 |
| 700 | compressive 1.1 | 0.9 |

Dependency of photoconductivity $\sigma p$ to radio frequency power is slightly larger and satisfies the condition $\sigma p > 10^{-7} \Omega^{-1}$ cm$^{-1}$ over a large range so that it designates sufficient value as the electrophotographic photoreceptor.

As described above the range of the radio frequency power, by which the film and the substrate do not peel off and the internal stress i.e., is small, is 70 to 130% of the saturated power Ps.

The power density D at the substrate surface is selected in the range of the radio frequency power of 300 to 700 W for a surface area of approximately 1,500 cm$^2$. Accordingly, the power density range for Table I covers 0.20 W/cm$^2 \leq D \leq 0.47$ W/cm$^2$. The power density may suitably range from 0.19 to 0.93 W/cm$^2$.

Since the film grown in this zone satisfies $0.9 \leq \alpha(2000)/\alpha(2100) \leq 1.1$, the zone 2 can also be formed by measuring the infrared absorption spectrum in addition to measurement of film deposition rate.

As a second example, the following growth conditions for SiH$_4$ are selected. SiH$_4$ gas flow rate of 320 SCCM, gas pressure of 2 Torr, substrate surface area of 1500 cm$^2$, substrate temperature of 250° C., radio frequency power of 280~520 W, and power density at the substrate surface of 0.19~0.35 W/cm$^2$. In this second example, the stress and $\alpha(2000)/\alpha(2100)$ are obtained and shown in FIG. 3 and the following Table II.

TABLE II

| (at 320 SCCM for SiH$_4$) | | |
|---|---|---|
| Radio Frequency Power (W) | Full Stress | $\alpha(2000)/\alpha(2100)$ |
| 300 | Tensile | 1.6 |
| 390 | " | 1.4 |
| 510 | Compressive | 0.95 |
| 600 | " | 0.76 |

The utilization of growth condition in this zone can form a—Si:H film which satisfies the above three requirements so that application to the drum of electrophotographic photoreceptor can easily be performed.

What is claimed is:

1. A method of manufacturing thin amorphous silicon hydride film by a plasma CVD process comprising the steps of providing a substrate for supporting the amorphous silicon hydride film, providing raw material gas produced by mixing hydrogen silicide Si$_n$H$_{2n+2}$(n≧1) with additive gas in the concentration from about 0.1 to 10 parts per million by volume, setting a gas flow rate of the raw material gas in the range from about 200 to about 700 SCCM, applying radio frequency electric power to said gas in plasma CVD apparatus, said power being selected in the range from about 300 W to about 700 W to result in a ratio of electric power in watts to gas flow rate in SCCM of at least about 1, and growing thin amorphous silicon hydride film on the substrate from the raw material gas.

2. A method of manufacturing thin amorphous silicon hydride film as claimed in claim 1, wherein the given raw material gas pressure is 1 to 3 Torr.

3. A method of manufacturing thin amorphous silicon hydride film as claimed in claim 2, wherein the substrate is heated to a temperature of 200° to 300° C., the additive gas is at least one selected from a group of B$_2$H$_6$, PH$_3$ and O$_2$, N$_2$O and, hydrocarbons, and the hydrogen silicide is monosilane.

4. A method of manufacturing thin amorphous silicon hydride film by a plasma CVC process comprising the steps of providing a substrate for supporting the amorphous silicon hydride film, providing raw material gas produced by mixing hydrogen silicide Si$_n$H$_{2n+2}$(n≧1) with additive gas in a concentration from about 0.1 to about 10 parts per million by volume, setting a gas flow rate of the raw material gas in the range of from about 200 to about 700 SCCM, applying radio frequency electric power to said gas in a plasma CVD apparatus, said power being in the range of about 300 W to about 700 W and selected to produce a thin amorphous film havng a ratio of infrared absorption of the Si—H bond to the infrared absorption of the Si—H$_2$ bond in the range of about 0.9 to about 1.1.

5. A method of manufacturing thin amorphous silicon hydride film by a plasma CVD process comprising the steps of providing a substrate for supporting the amorphous silicon hydride film, providing raw material gas produced by mixing hydrogen silicide Si$_n$H$_{2n+2}$(n≧1) with additive gas in the concentration from about 0.1 to 10 parts per million by volume, setting a gas flow rate of the raw material gas in the range from about 200 to about 700 SCCM, applying radio frequency electric power to said gas in plasma CVD apparatus, said power defining at a surface of said substrate power density of approximately 0.19 to 0.47 W/cm$^2$ to result in a ratio of electric power in watts to gas flow rate in SCCM of least about 1, and growing thin amorphous silicon hydride film on the substrate from the raw material gas.

6. A method of manufacturing thin amorphous silicon hydride film by a plasma CVD process comprising the steps of providing a substrate for supporting the amorphous silicon hydride film, providing raw material gas produced by mixing hydrogen silicide $Si_nH_{2n+2}(n \geq 1)$ with additive gas in the concentration from about 0.1 to 10 parts per million by volume, setting a gas flow rate of the raw material gas in the range from about 200 to about 700 SCCM, applying radio frequency electric power to said gas in plasma CVD apparatus, said power defining at a surface of said substrate power density of approximately 0.16 to 0.93 W/cm$^2$ to result in a ratio of electric power in watts to gas flow rate in SCCM of least about 1, and growing thin amorphous silicon hydride film on the substrate from the raw material gas.

* * * * *

UNITED STATES PATENT AND TRADEMARK OFFICE
CERTIFICATE OF CORRECTION

PATENT NO.   : 4,631,198
DATED        : December 23, 1986
INVENTOR(S)  : Hiroaki Kakinuma, et al.

It is certified that error appears in the above-identified patent and that said Letters Patent is hereby corrected as shown below:

Column 1, line 16, change "ore" to --more--;

Column 2, line 35, change "lest" to --least--;

Column 3, line 16, "°(2000)" should be --$\alpha$(2000)--

Column 3, line 47, "i.e., is small," should be

--is small, i.e.,--;

Column 4, line 40, change "CVC" to --CVD--.

Signed and Sealed this

Fifteenth Day of September, 1987

*Attest:*

DONALD J. QUIGG

*Attesting Officer*   *Commissioner of Patents and Trademarks*